United States Patent
Park et al.

(10) Patent No.: US 8,405,161 B2
(45) Date of Patent: Mar. 26, 2013

(54) DRIVING DEVICE FOR UNIT PIXEL OF ORGANIC LIGHT EMITTING DISPLAY AND METHOD OF MANUFACTURING THE SAME

(75) Inventors: Kyung-bae Park, Yongin-si (KR); Jang-yeon Kwon, Yongin-si (KR); Sang-yoon Lee, Yongin-si (KR); Ji-sim Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 470 days.

(21) Appl. No.: 11/877,308

(22) Filed: Oct. 23, 2007

(65) Prior Publication Data

US 2008/0116457 A1    May 22, 2008

(30) Foreign Application Priority Data

Nov. 22, 2006 (KR) .................. 10-2006-0116057

(51) Int. Cl.
*H01L 27/088* (2006.01)
(52) U.S. Cl. ................... 257/401; 257/66; 349/199
(58) Field of Classification Search .............. 257/401, 257/66, E27.006; 349/199
See application file for complete search history.

(56) References Cited

U.S. PATENT DOCUMENTS

| | | | | |
|---|---|---|---|---|
| 5,372,959 A | * | 12/1994 | Chan | 438/157 |
| 6,291,863 B1 | * | 9/2001 | Chan | 257/401 |
| 6,714,178 B2 | * | 3/2004 | Koyama et al. | 345/76 |
| 7,312,568 B2 | * | 12/2007 | Park | 313/504 |
| 7,425,749 B2 | * | 9/2008 | Hartzell et al. | 257/414 |

FOREIGN PATENT DOCUMENTS

| | | |
|---|---|---|
| JP | 2002-033481 A | 1/2002 |
| JP | 2003-223120 A | 8/2003 |
| JP | 2006-178031 A | 7/2006 |
| KR | 1020040060473 A | 7/2004 |
| KR | 1020060059582 A | 6/2006 |
| KR | 1020060060937 A | 6/2006 |

OTHER PUBLICATIONS

Korean Office Action with English Translation for Application No. 10-2006-0116057 dated Jul. 13, 2012.

* cited by examiner

*Primary Examiner* — Howard Weiss
*Assistant Examiner* — Steven Rao
(74) *Attorney, Agent, or Firm* — Cantor Colburn LLP

(57) ABSTRACT

Provided are a driving device for a unit pixel of an organic light emitting display having an improved structure and a method of manufacturing the same.

16 Claims, 15 Drawing Sheets

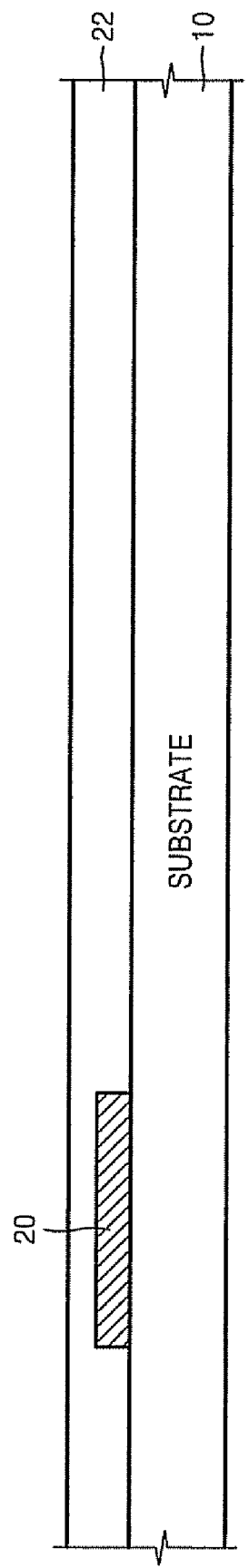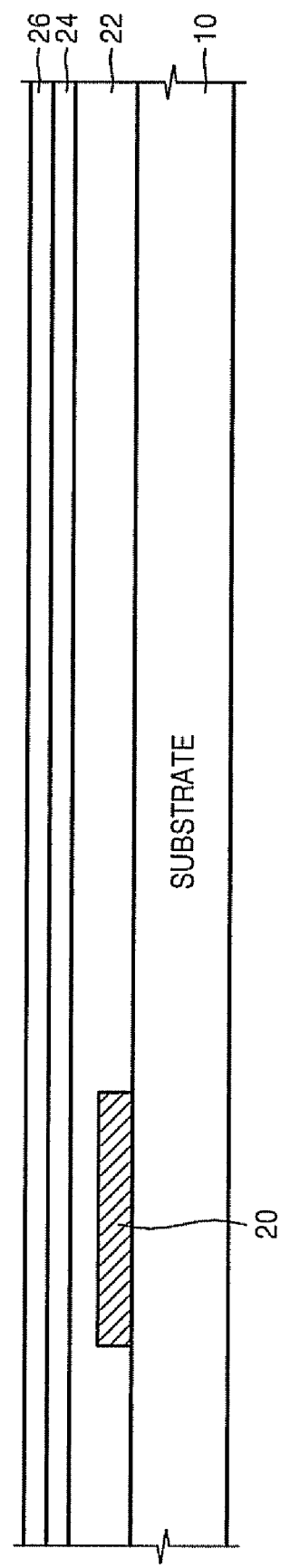

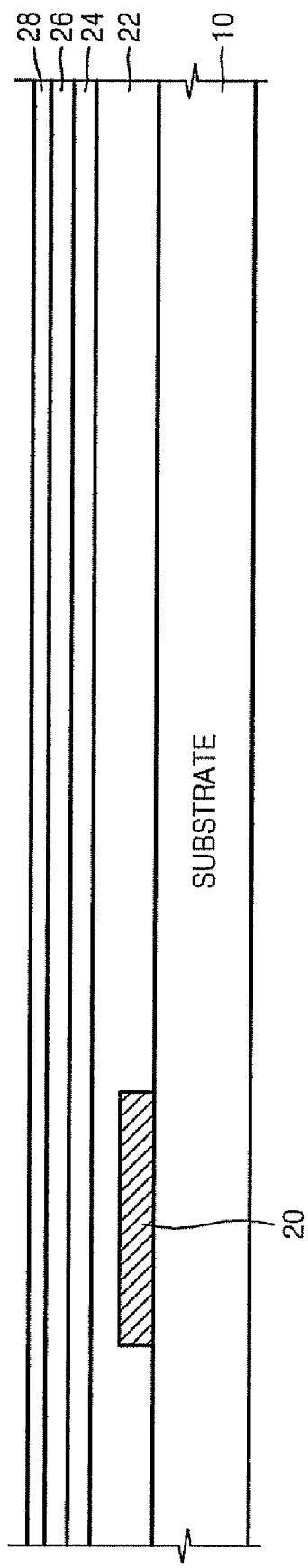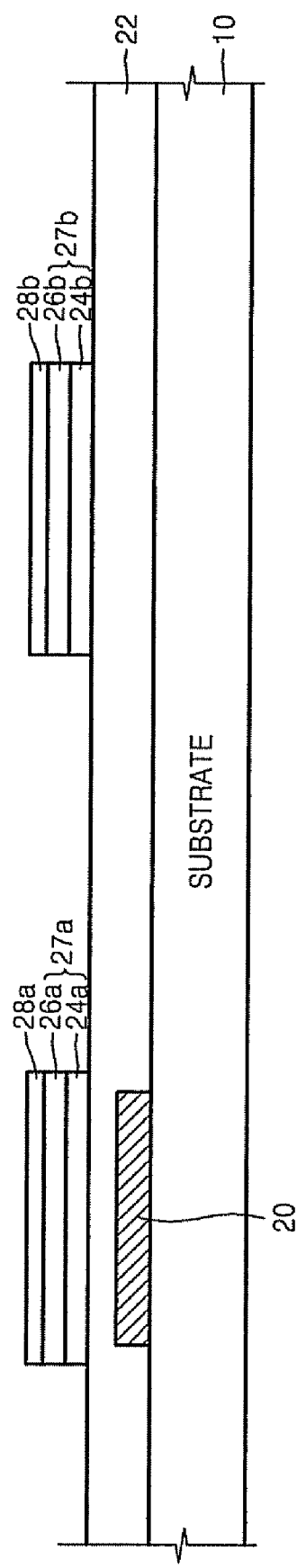

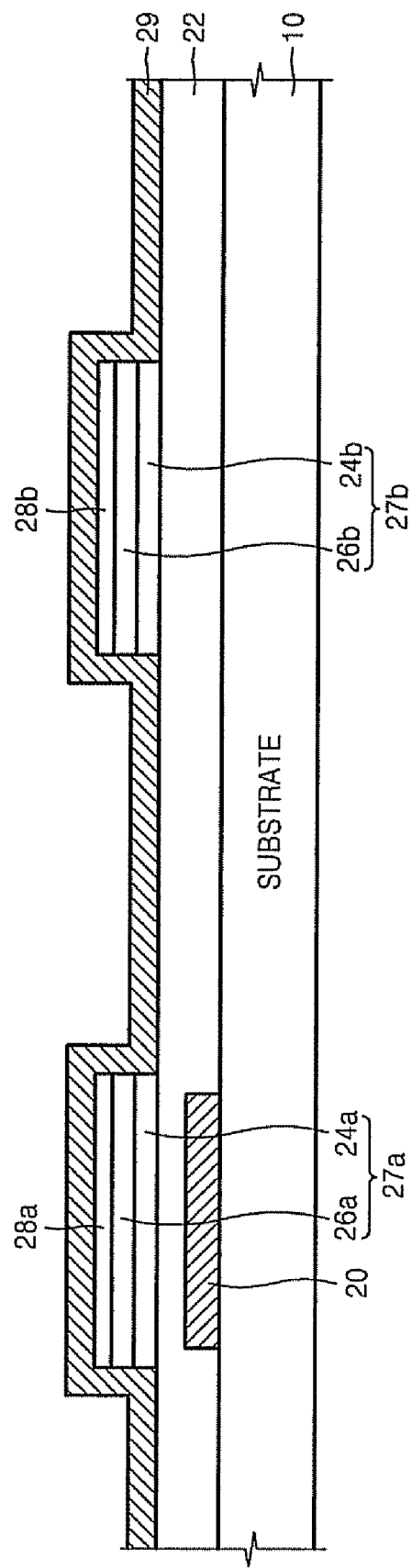
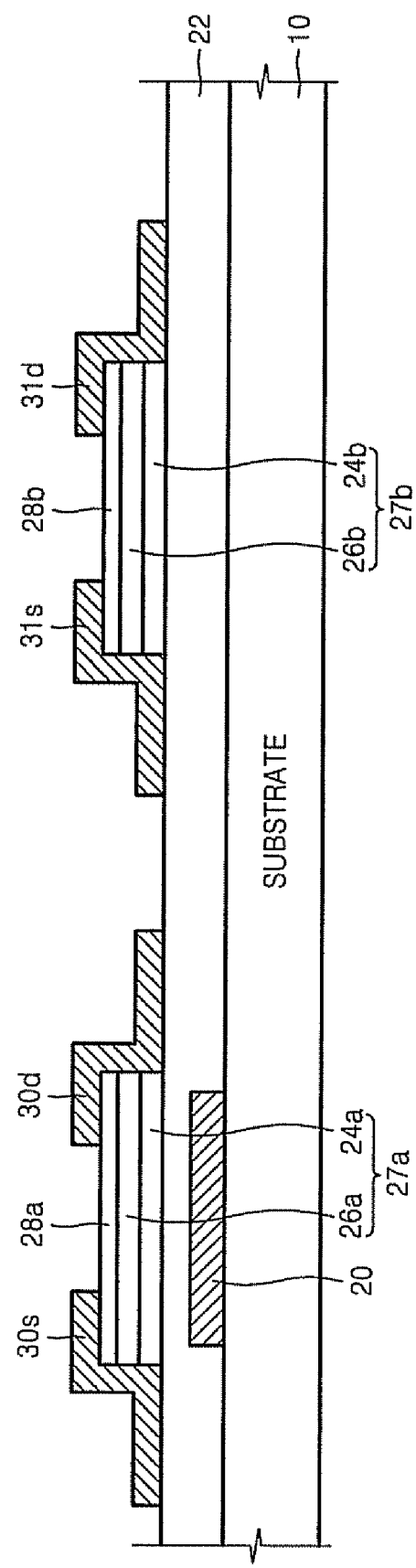

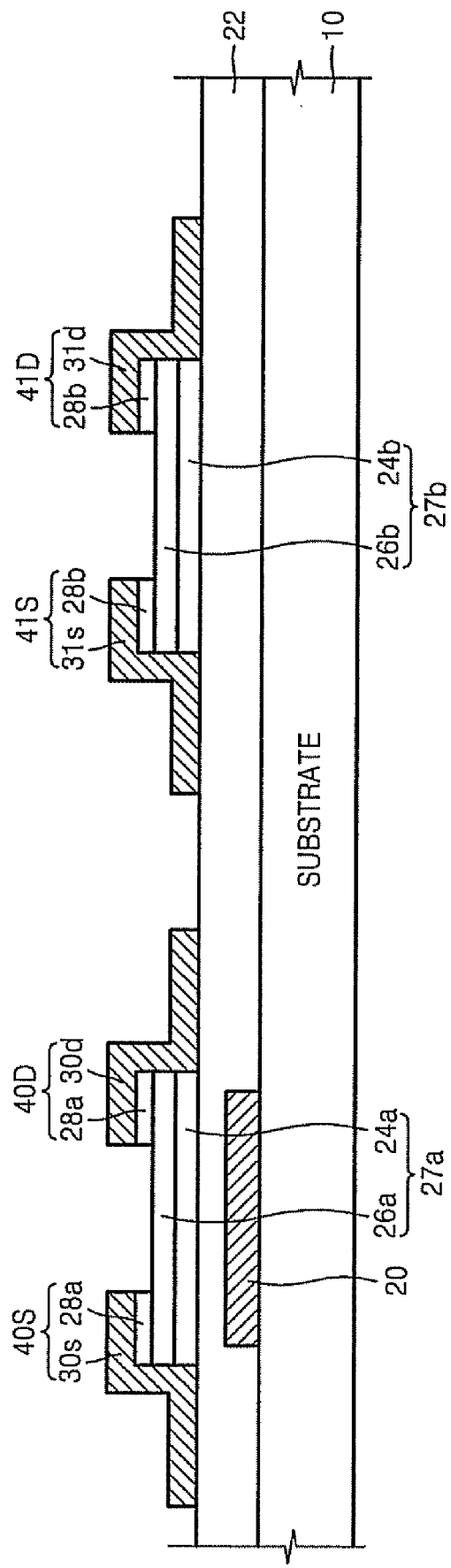

DRIVING DEVICE FOR UNIT PIXEL OF ORGANIC LIGHT EMITTING DISPLAY AND METHOD OF MANUFACTURING THE SAME

CROSS-REFERENCE TO RELATED PATENT APPLICATIONS

This application claims priority to Korean Patent Application No. 10-2006-0116057, filed on Nov. 22, 2006, and all the benefits accruing therefrom under 35 U.S.C. §119, the contents of which are incorporated herein by reference in their entirety.

BACKGROUND OF THE INVENTION

1. Field of the Invention

Disclosed herein is a driving device for a unit pixel of an organic light emitting display, and more specifically, to a driving device for a unit pixel of an OLED having an improved structure in which the driving device can be more easily manufactured.

2. Description of the Related Art

Liquid crystal displays (LCDs), because they are not heavy and have low power consumption, are desirable for use in flat panel displays (FPDs). However, since LCDs are light-receiving type displays, it can be difficult to meet technical specifications for brightness, contrast, view angle, as well as use in larger sized displays. Development for new FPDs that can overcome these disadvantages has proceeded rapidly. Organic light emitting displays (OLEDs), a new possibility for use with FPDs, have a two-dimensional arrangement and self light-emitting pixels. Thus, OLEDs have excellent characteristics, such as excellent view angle and contrast. It is highly desirable that OLEDs do not need backlights, as are needed with LCDs. Thus, OLEDs can be made even lighter and smaller and have very low power consumption. In addition, since OLEDs can be directly driven by low voltages, have a fast response speed, and are entirely solid bodies, the OLEDs tend to be resistant to external shocks, and can be used in a wide temperature range. Also highly desirable is that the OLEDs have low manufacturing costs. Specifically, if OLEDs are driven using an active matrix method by which transistors as switching devices are disposed in each pixel, the OLEDs show the same brightness even if low currents are applied to the OLEDs. Thus, the OLEDs require less power, have high definition, and can utilized in large FPDs.

Two thin film transistors (TFTs), a switching TFT and a driving TFT, can be provided in each unit pixel of the active matrix type OLEDs, so as to drive an OLED. The switching TFT turns on/off a current supplied to each unit pixel, and the driving TFT provides currents allocated to the OLED. Due to this role assignment, characteristics and specifications of the switching TFT and driving TFT are different. For example, the switching TFT can have a small leakage current and a large on/off ratio. On the other hand, the driving TFT is required to have high mobility and reliability. In order to meet the requirements, the switching TFT can be formed as an amorphous silicon TFT and the driving TFT can be formed as a polycrystalline silicon transistor.

However, the process of manufacturing the switching TFT and the process of manufacturing the driving TFT are separately performed. This results in increased manufacturing complexity, which increases costs. Meanwhile, when an amorphous silicon TFT is simultaneously used as the switching TFT and the driving TFT, the amorphous silicon TFT is worthy of a switching TFT, but low electron mobility and reliability hinder practical applicability. Thus, it is difficult to implement an OLED having excellent characteristics. Contrary to this, when a polycrystalline silicon TFT is used as a switching TFT, the polycrystalline silicon TFT is worthy of a driving TFT, but a large leakage current in the off-state hinders practical applicability. Thus, the possibility of use of the polycrystalline silicon TFT as a switching transistor is reduced.

SUMMARY OF THE INVENTION

Disclosed herein is a driving device for a unit pixel of an OLED having an improved structure in which the driving device can be manufactured with a smaller number of processes and in simpler and easier processes. Disclosed too is a method of manufacturing the same.

In one embodiment, there is provided a driving device for a unit pixel of an OLED, the driving device for a unit pixel comprising: a pair of a switching thin film transistor (TFT) and a driving TFT, which are formed on a substrate and in communication with each other, wherein the switching TFT is formed in a bottom gate structure, the bottom gate structure comprising a first dual channel layer having a first amorphous silicon layer and a first polycrystalline silicon layer, and a first gate electrode formed below the first dual channel layer and facing the first amorphous silicon layer, and the driving TFT is formed in a top gate structure, the top gate structure comprising a second dual channel layer having a second amorphous silicon layer and a second polycrystalline silicon layer, and a second gate electrode formed above the second dual channel layer and facing the second amorphous silicon layer.

In another embodiment, there is provided a method of manufacturing a driving device for a unit pixel of an OLED comprising a switching TFT and driving TFT that are formed on a substrate and are in electrical communication with each other. The method comprises forming the switching TFT in a bottom gate structure, the bottom gate structure comprising a first dual channel layer having a first amorphous silicon layer and a first polycrystalline silicon layer, and a first gate electrode formed below the first dual channel layer and facing the first amorphous silicon layer; and forming the driving TFT in a top gate structure, the top gate structure comprising a second dual channel layer having a second amorphous silicon layer and a second polycrystalline silicon layer, and a second gate electrode formed above the second dual channel layer and facing the second amorphous silicon layer, wherein the first dual channel layer and the second dual channel layer are simultaneously formed in one process.

The forming of the switching TFT can comprise: forming a first gate electrode on a substrate; forming a first insulating layer that covers the first gate electrode on the substrate; forming a first dual channel layer that comprises a first amorphous silicon layer and first polycrystalline silicon layer on the first insulating layer; and forming a first source region and a first drain region at opposite ends of the first dual channel layer, respectively.

The forming of the driving TFT can comprise: forming a second dual channel layer on the first insulating layer to be separated from the first dual channel layer, the second dual channel layer comprising a second amorphous silicon layer and second polycrystalline silicon layer; forming a second source region and a second drain region at opposite ends of the second dual channel layer, respectively; forming a second insulating layer that covers the second dual channel layer, the second source region, and the second drain region; and forming a second gate electrode on the second insulating layer to face the second polycrystalline silicon layer.

In another embodiment, there is provided an OLED comprising a plurality of unit pixels disposed on a substrate in a matrix shape, wherein each of the unit pixels comprises: a driving device for a unit pixel comprising a switching TFT and driving TFT that are in electrical communication with each other; and an OLED for a unit pixel, wherein the switching TFT is formed in a bottom gate structure, the bottom gate structure comprising a first dual channel layer having a first amorphous silicon layer and a first polycrystalline silicon layer, and a first gate electrode formed below the first dual channel layer and facing the first amorphous silicon layer, and the driving TFT is formed in a top gate structure, the top gate structure comprising a second dual channel layer having a second amorphous silicon layer and a second polycrystalline silicon layer, and a second gate electrode formed above the second dual channel layer and facing the second amorphous silicon layer.

In one embodiment, the OLED and the method of manufacturing the same have been improved so that channels in a switching TFT and a driving TFT can be simultaneously formed in one process. As a result, the driving device for a unit pixel of an OLED disclosed herein can be manufactured in a smaller number of processes and in simpler and easier processes compared to the prior art.

BRIEF DESCRIPTION OF THE DRAWINGS

The above and other features and advantages will become more apparent by describing in detail exemplary embodiments thereof with reference to the attached drawings in which:

FIGS. 4A through 4K are schematic drawings illustrating a method of manufacturing a driving device for a unit pixel of an OLED.

DETAILED DESCRIPTION OF THE INVENTION

Figure 1:
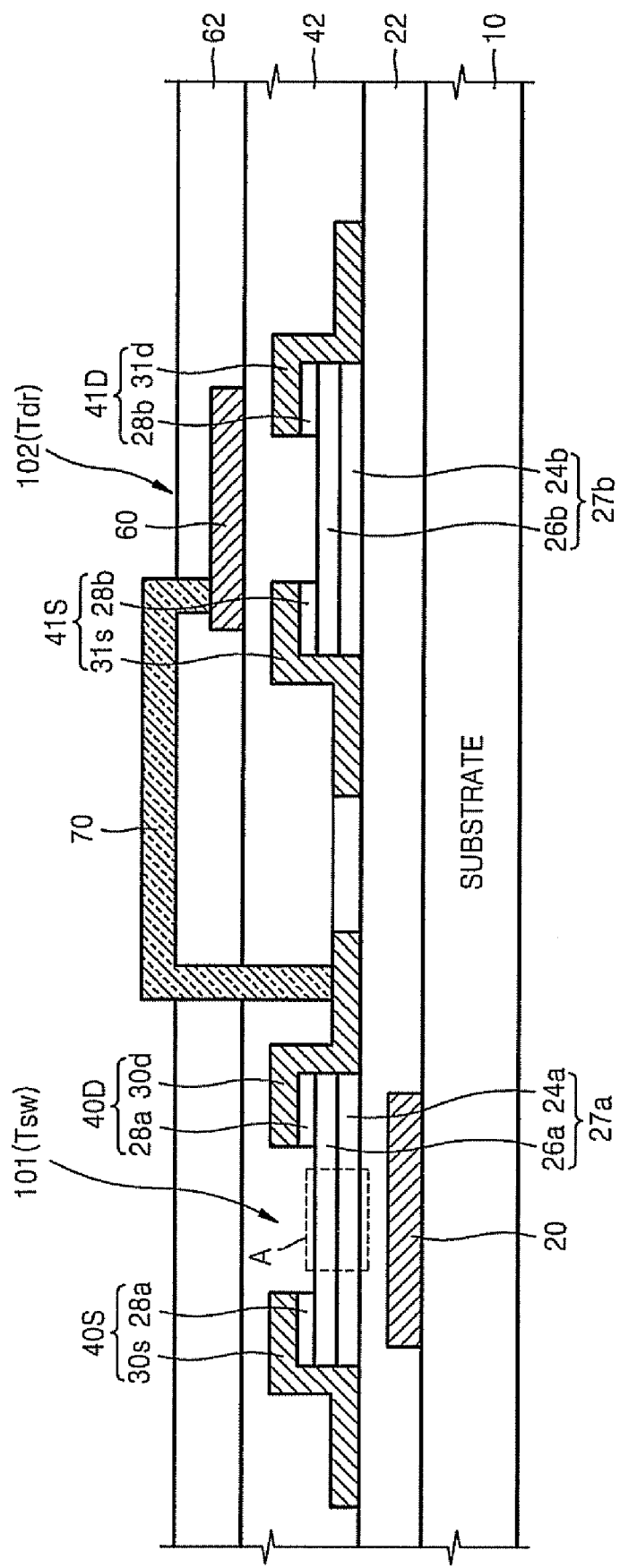
FIG. 1 is a schematic cross-sectional view of a driving device for a unit pixel of an OLED.

The invention is described more fully hereinafter with reference to the accompanying drawings, in which embodiments of the invention are shown. This should not be construed as limiting the claims to the embodiments shown. Rather, these embodiments are provided to convey the scope of the invention to those skilled in the art. In the drawings, the size and relative sizes of elements and regions may be exaggerated for clarity.

It will be understood that when an element or layer is referred to as being "on", "interposed", "disposed", or "between" another element or layer, it can be directly on, interposed, disposed, or between the other element or layer or intervening elements or layers can be present.

The terms "first," "second," and the like, "primary," "secondary," and the like, as used herein do not denote any order, quantity, or importance, but rather are used to distinguish one element, region, component, layer, or section from another. The terms "front", "back", "bottom", and/or "top" are used herein, unless otherwise noted, merely for convenience of description, and are not limited to any one position or spatial orientation.

The terms "a" and "an" do not denote a limitation of quantity, but rather denote the presence of at least one of the referenced item. The suffix "(s)" as used herein is intended to include both the singular and the plural of the term that it modifies, thereby comprising one or more of that term (e.g., the layer(s) includes one or more layers).

Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

The endpoints of all ranges directed to the same component or property are inclusive of the endpoint and independently combinable, e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc. The modifier "about" used in connection with a quantity is inclusive of the stated value and has the meaning dictated by the context (e.g., includes the degree of error associated with measurement of the particular quantity).

Unless defined otherwise, technical and scientific terms used herein have the same meaning as is commonly understood by one of skill in the art to which this invention belongs.

Figure 2:
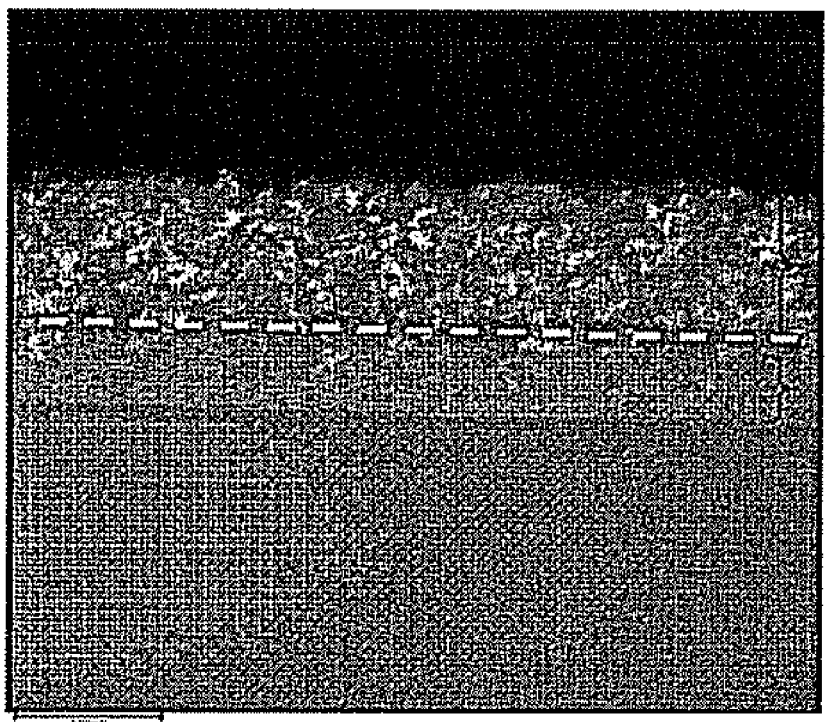
FIG. 2 is a cross-sectional scanning electronic microscope (SEM) photo of a first dual channel layer, (rregion A) of FIG. 1.
Figure 3A:
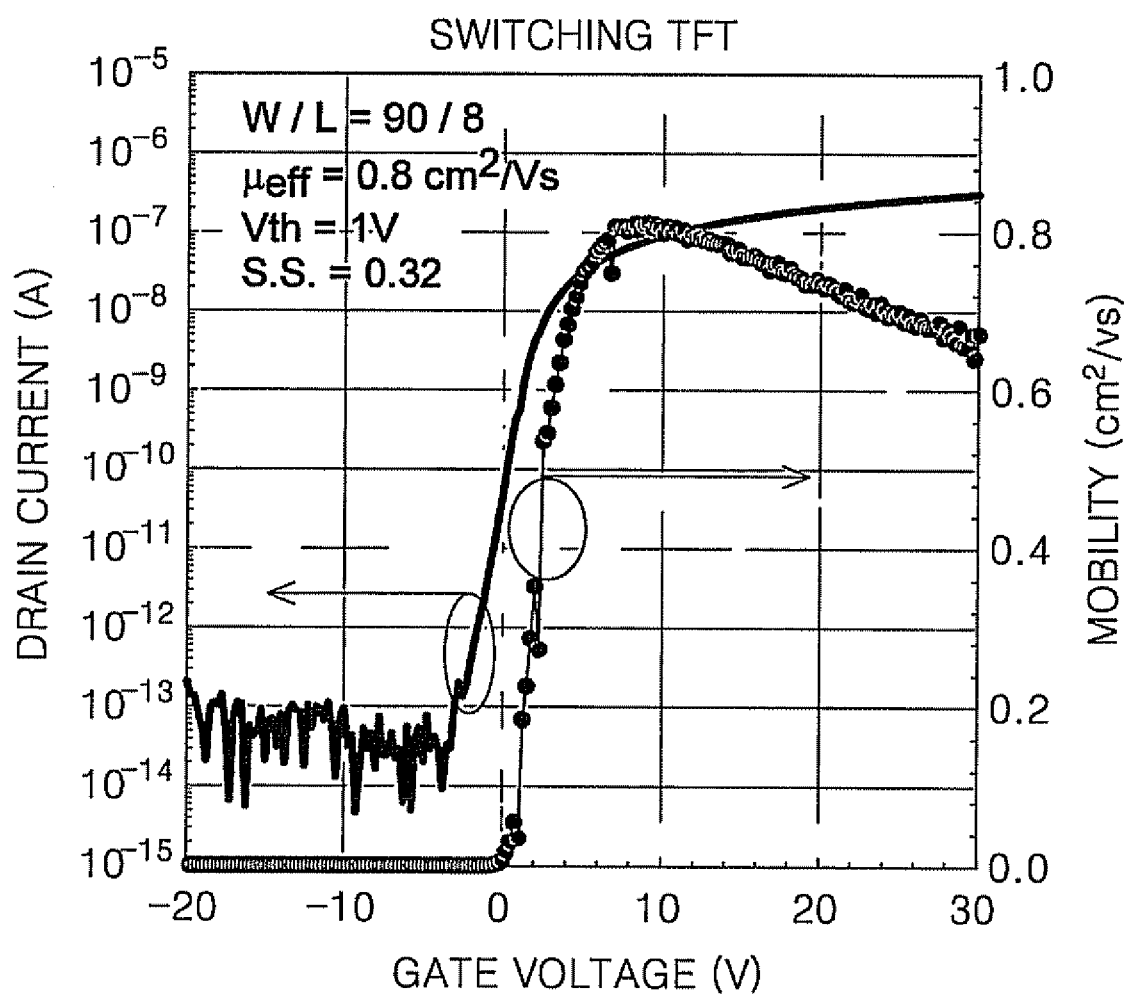
FIGS. 3A and 3B are graphs showing switching characteristics of a switching transistor TFT and a driving transistor TFT, respectively, in the driving device for a unit pixel of an organic light emitting display illustrated in FIG. 1.
Figure 3B:
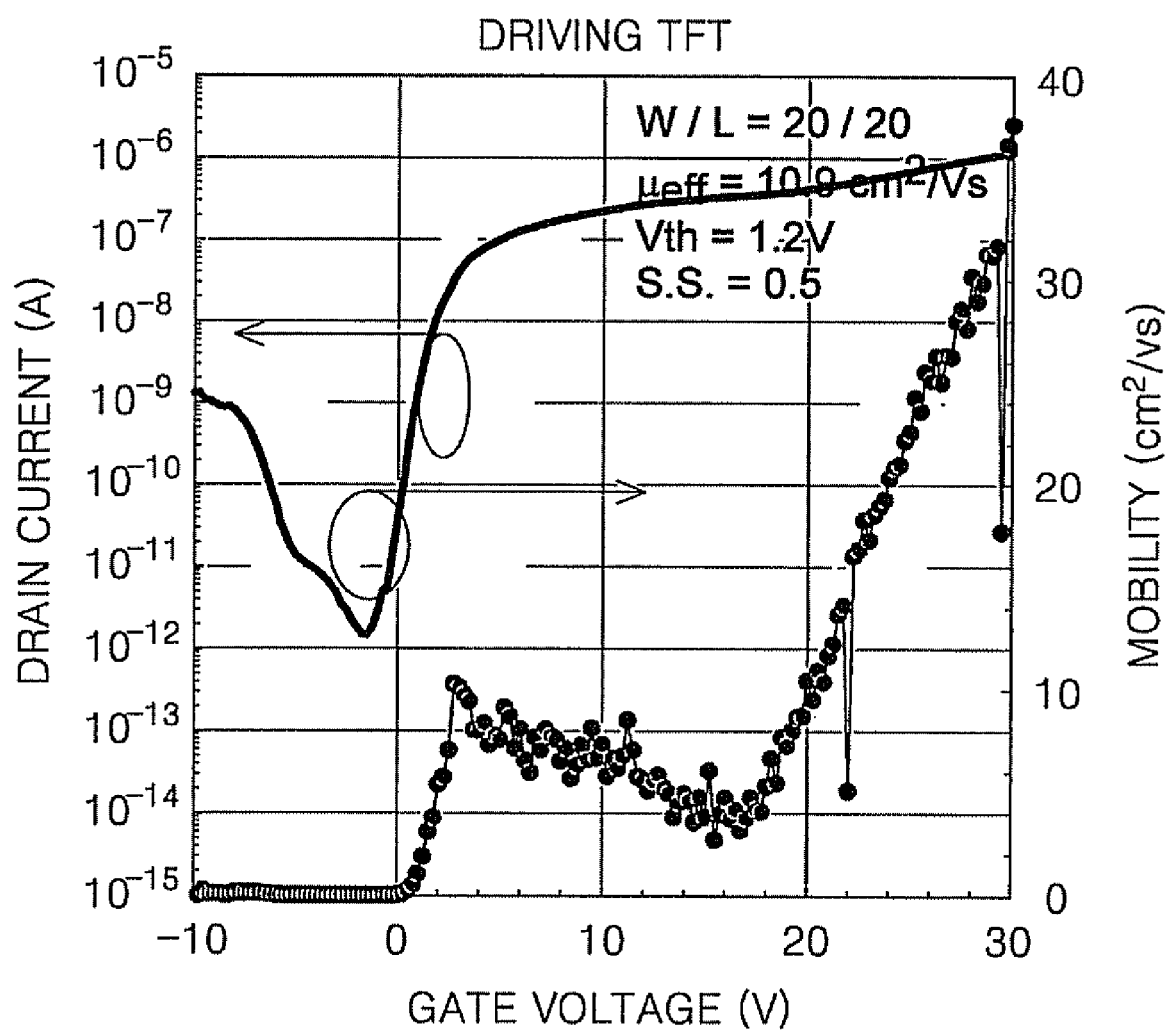

FIG. 1 is a schematic cross-sectional view of a driving device for a unit pixel of an OLED. FIG. 2 is a cross-sectional scanning electronic microscope (SEM) photo of a first dual channel layer (region A) of FIG. 1. FIGS. 3A and 3B are graphs showing switching characteristics of a switching TFT 101 and a driving TFT 102, respectively, in the driving device for a unit pixel of an OLED as illustrated in FIG. 1.

Referring to FIG. 1, a driving device for a unit pixel of an OLED includes a switching TFT 101 and a driving TFT 102, which are in communication with each other, and are disposed on a substrate 10.

The switching TFT 101 ($T_{sw}$) comprises a first dual channel layer 27a having a first amorphous silicon layer 24a and a first polycrystalline silicon layer 26a which are adjacent to each other. A first gate electrode 20 is formed below the first dual channel layer 27a. The switching TFT 101 is formed in a bottom gate structure, as illustrated in FIG. 1. A first insulating layer 22 is disposed between the first dual channel layer 27a and the first gate electrode 20. A first source region 40S and a first drain region 40D are formed at opposite ends of the first dual channel layer 27a, respectively. The first source region 40S can comprise an n-doped silicon (Si) layer 28a and a first source electrode 30s, which are disposed on one end of the first dual channel layer 27a. The first drain region 40D can comprise an n-doped Si layer 28a and a first drain electrode 30d, which are disposed on an opposite end of the first dual channel layer 27a. The n-doped Si layer 28a is a Si layer comprising an n-type dopant, such as As and P, and can be formed using a deposition process separate from that used to form the first dual channel layer 27a.

The driving TFT 102 ($T_{dr}$) comprises a second dual channel layer 27b having a second amorphous silicon layer 24b and a second polycrystalline silicon layer 26b which are adjacent to each other. A second gate electrode 60 is formed above the second dual channel layer. The driving TFT 102 is formed in a top gate structure, as illustrated in FIG. 1. A second insulating layer 42 is disposed between the second dual channel layer 27*b* and the second gate electrode 60. A second source region 41S and a second drain region 41D are formed at opposite ends of the second dual channel layer 27*b*, respectively. The second source region 41S can comprise an n-doped Si layer 28*b* and a second source electrode 31*s*, which are disposed on an end of the second dual channel layer 27*b*. The second drain region 41D can comprise an n-doped Si layer 28*b* and a second drain electrode 31*d*, which are disposed on the opposite end of the second dual channel layer 27*b*. The n-doped Si layer 28*b* is a Si layer comprising an n-type dopant, such as As and P, and can be formed using a deposition process separate from deposition process used to deposit the second dual channel layer 27*b*.

The first source region 40S or the first drain region 40D is in communication with the second gate electrode 60 via a first interconnection line 70 so that an electrical signal can be input to the driving TFT 102 from the switching TFT 101.

In the structure of a driving device for a unit pixel of an OLED, the switching TFT 101 turns on/off a current supplied to the unit pixel, and the driving TFT 102 provides currents allocated to an OLED (not shown) formed in the unit pixel. Due to this role assignment, characteristics and specifications for the switching TFT 101 and the driving TFT 102 are different. For example, the switching TFT 101 can have a small leakage current and a large on/off ratio. On the other hand, it is desirable for the driving TFT 102 to have high mobility and reliability. In order to have these capabilities, the switching TFT 101 can be formed as an amorphous silicon TFT and the driving TFT 102 can be formed as a polycrystalline silicon TFT.

Hence, the driving device for a unit pixel of an OLED employs a dual channel layer having a dual layer structure in which an amorphous silicon (a-Si) layer and a polycrystalline silicon (poly-Si) layer are disposed, in each of the switching TFT 101 and the driving TFT 102. The dual channel layer having the dual layer structure can perform functions of both an amorphous silicon channel and a polycrystalline silicon channel according to an arrangement relation between the dual channel layer and a gate electrode. Specifically, the switching TFT 101 is formed with a bottom gate structure in which the first gate electrode 20 is disposed below the first dual channel layer 27*a*. Thus, the first amorphous silicon layer 24*a* and the first gate electrode 20 are adjacent to each other and face each other. They are however, not in physical contact with one another. Using this bottom gate structure, the first amorphous silicon layer 24*a* of the first dual channel layer 27*a* can be selectively used as a channel. As a result, the switching TFT 101 can function as an amorphous silicon TFT having excellent switching characteristics.

The driving TFT 102 is formed in a top gate structure in which the second gate electrode 60 is disposed above the second dual channel layer 27*b*. Thus, the second polycrystalline silicon layer 26*b* and the second gate electrode 60 are adjacent to each other and face each other. They are however, not in physical contact with one another. From the top gate structure, only the second polycrystalline silicon layer 26*b* of the second dual channel layer 27*b* can be selectively used as a channel. As a result, the driving TFT 102 can function as a polycrystalline silicon TFT having high mobility.

Each of the first and second amorphous silicon layers 24*a* and 24*b* can be formed to a thickness of about 10 to about 500 angstroms (Å), and each of the first and second polycrystalline silicon layers 26*a* and 26*b* can be formed to a thickness of about 500 to about 3000 Å.

In one embodiment, the structure of the driving device for a unit pixel of an organic light emitting display has been improved so that channels in a switching TFT and a driving TFT can be simultaneously formed in one process. As a result, the driving device for a unit pixel of an OLED can be manufactured in a smaller number of processes and by simpler and easier processes compared with the manufacturing process used for other comparative commercially available devices.

FIGS. 4A through 4K are flowcharts illustrating a method of manufacturing a driving device for a unit pixel of an OLED.

In the method of manufacturing a driving device for a unit pixel of an OLED as illustrated in FIGS. 4A through 4K, each thin layer can be formed using thin layer deposition processes that are generally used in a semiconductor manufacturing process, for example, physical vapor deposition (PVD), chemical vapor deposition (CVD) or plasma enhanced chemical vapor deposition (PECVD).

Referring to FIGS. 4A through 4D, a gate metal, such as aluminum (Al) or molybdenum (Mo), is deposited on substrate 10 to a thickness of about 2000 to about 4000 Å and then is patterned, thereby forming a first gate electrode 20. The substrate 10 can be an amorphous substrate or an insulating substrate. Thereafter, a first insulating layer 22 is formed on the entire surface of the substrate 10 using a material, such as $SiO_x$ or $SiN_x$ so that the first gate electrode 20 can be disposed in the first insulating layer 22. Next, an amorphous silicon layer 24 and a polycrystalline silicon layer 26 are disposed on the first insulating layer 22. The amorphous silicon layer 24 can be formed to a thickness of about 10 to about 500 Å, and the polycrystalline silicon layer 26 can be formed to a thickness of about 500 to about 3000 Å. The amorphous silicon layer 24 and the polycrystalline silicon layer 26 can be consecutively formed in one deposition process. For example, after the substrate 10 on which the first insulating layer 22 is formed is installed into a PECVD chamber, the temperature of the PECVD chamber is kept at about 20° C. to about 500° C., and $SiH_4$ (gas) and $H_2$ (gas) are supplied into the PECVD chamber and are reacted for about 5 to about 60 minutes so that the amorphous silicon layer 24 and the polycrystalline silicon layer 26 can be consecutively formed on the first insulating layer 22. The mixture ratio of $SiH_4$ (gas) and $H_2$ (gas), $H_2$ (gas) can be controlled to about 90 to about 99 volume (vol.) %. In this case, the pressure of the PECVD chamber can be controlled to about 30 to about 10000 milli-Torr, and the RF power of PECVD can be controlled to about 100 to about 1000 W.

Next, an n-doped Si layer 28 is formed on the polycrystalline silicon layer 26 to a thickness of about 200 to about 1000 Å. Here, arsenic (As) or phosphorus (P) is used as an n-dopant, and the n-dopant is supplied into the PECVD chamber together with $SiH_4$ (gas) and $H_2$ (gas). In an embodiment, the n-doped Si layer 28 is formed using a separate deposition process but is not limited to this. The n-doped Si layer 28 can be formed using other methods such as ion implantation.

In FIG. 4D, the n-doped Si layer 28, the polycrystalline silicon layer 26, and the amorphous silicon layer 24 are patterned, thereby forming first and second channel portions, separated from each other by a selected gap. Here, the first channel portion comprises a first dual channel layer 27*a* having a first amorphous silicon layer 24*a* and a first polycrystalline silicon layer 26*a*, and an n-doped Si layer 28*a* disposed on the first dual channel layer 27*a*. The second channel portion comprises a second dual channel layer 27*b* having a second amorphous silicon layer 24b and a second polycrystalline silicon layer 26b, and an n-doped Si layer 28b disposed on the second dual channel layer 27b.

Referring to FIGS. 4E through 4G, an electrode layer 29, covering the first and second channel portions, is formed on the first insulating layer 22 using metal, such as aluminum (Al) or molybdenum (Mo), to a thickness of about 2000 to about 4000 Å. The electrode layer is then patterned, thereby forming a first source electrode 30s and a first drain electrode 30d at opposite sides of the first channel portion, respectively, and forming a second source electrode 31s and a second drain electrode 31d at opposites sides of the second channel portion, respectively.

Next, a region of the n-doped Si layer 28a connecting the first source electrode 30s and the first drain electrode 30d is selectively etched, thereby exposing a top surface of the first polycrystalline silicon layer 26a. In this case, a process of etching the n-doped Si layer 28a can be performed by using the first source electrode 30s and the first drain electrode 30d as a mask. A process of patterning the electrode layer 29 and a process of etching the n-doped Si layer 28a so as to form the first source electrode 30s and the first drain electrode 30d can be performed simultaneously.

In addition, by using same method as the process of etching the n-doped Si layer 28a, a region of the n-doped Si layer 28b connecting the second source electrode 31a and the second drain electrode 31d is selectively etched, thereby exposing a top surface of the second polycrystalline silicon layer 26b. In this case, a process of etching the n-doped Si layer 28b can be performed by using the second source electrode 31s and the second drain electrode 31d as a mask. The process of patterning the electrode layer 29 and the process of etching the n-doped Si layer 28b so as to form the second source electrode 31s and the second drain electrode 31d can be performed simultaneously. As a result of performing the process of FIG. 4G, a first source region 40S and a first drain region 40D can be formed at opposite sides of the first dual channel layer 27a, respectively. Here, the first source region 40S comprises an n-doped Si layer 28a and a first source electrode 30s, and the first drain region 40D comprises an n-doped Si layer 28a and a first drain electrode 30d. Similarly, a second source region 41S and a second drain region 41D can be formed at opposite ends of the second dual channel layer 27b, respectively. Here, the second source region 41S comprises an n-doped Si layer 28b and a second source electrode 31s, and the second drain region 41D comprises an n-doped Si layer 28b and a second drain electrode 31d.

Figure 4H:
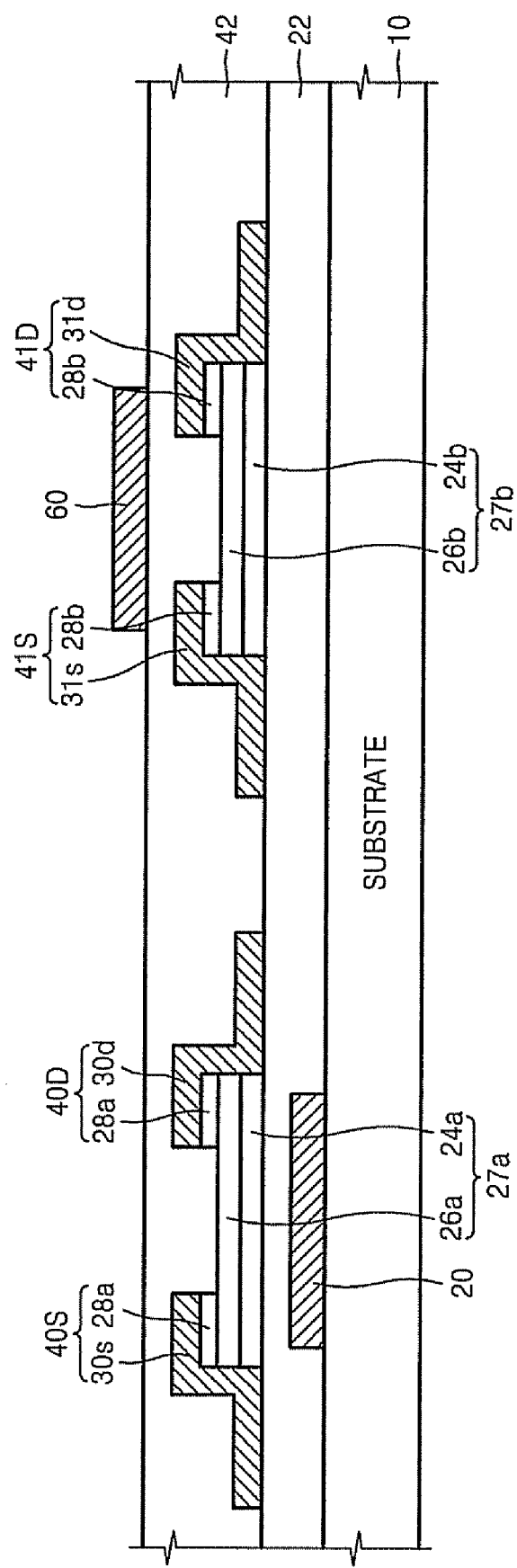

Referring to FIG. 4H, a second insulating layer 42 is formed on the first insulating layer 22 using a material, such as silica ($SiO_x$) or silicon nitride ($SiN_x$), so that all of the first dual channel layer 27a, the second dual channel layer 27b, the first source region 40S, the first drain region 40D, the second source region 40D, and the second drain region 41D are disposed in the second insulating layer 42. Next, a gate metal, such as Al or Mo, is deposited on the second insulating layer 42 to a thickness of about 2000 to about 4000 Å and then is patterned, thereby forming a second gate electrode 60.

Figure 4I:
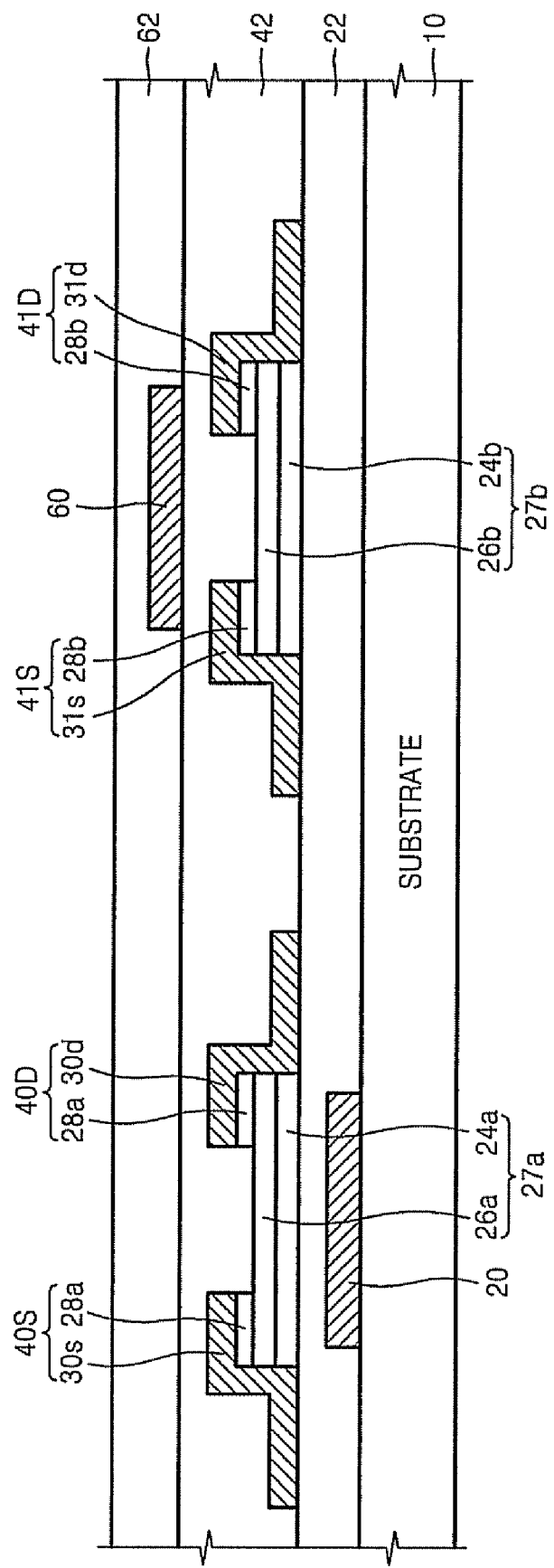
Figure 4J:
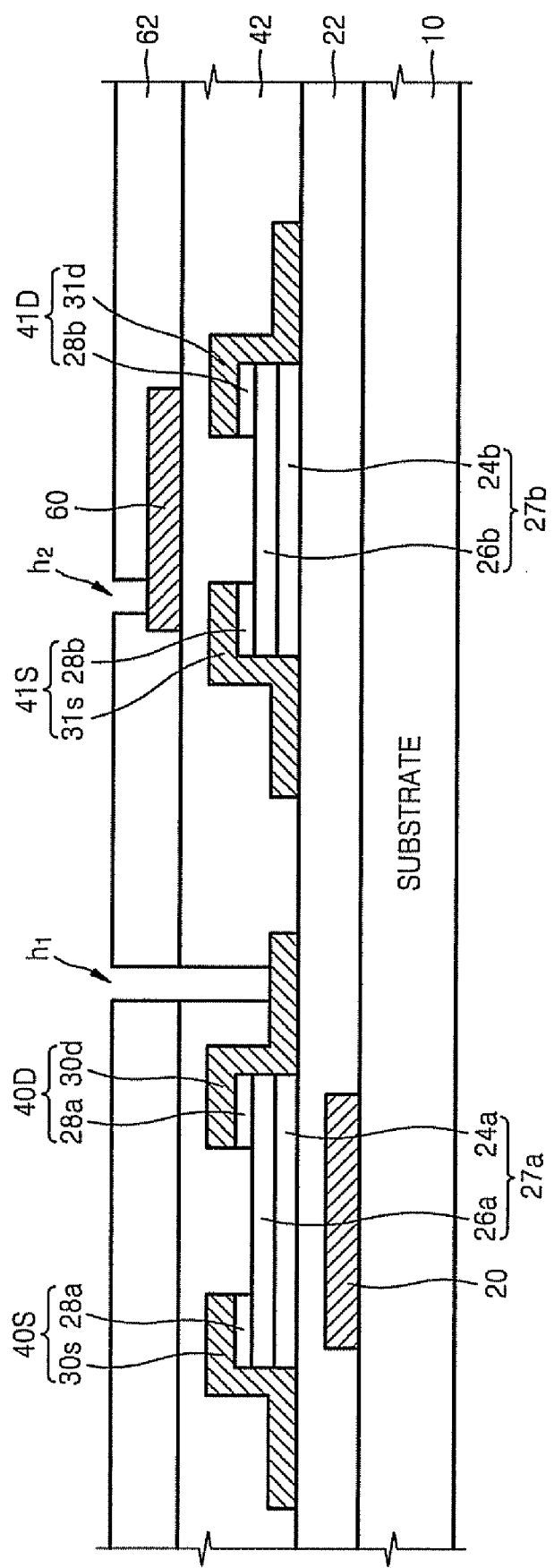
Figure 4K:
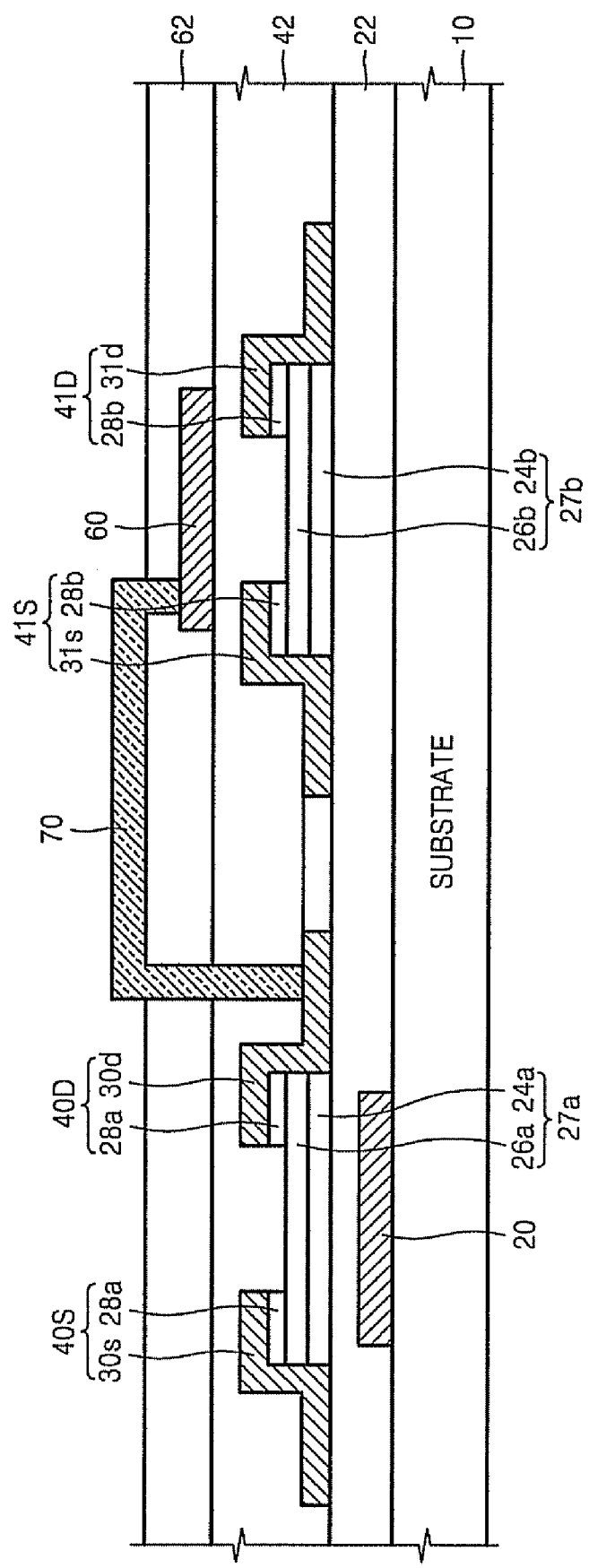

Referring to FIGS. 4I through 4K, the first drain electrode 30d is in communication with the second gate electrode 60 via a first interconnection line 70 so that an electrical signal can be sent to the second gate electrode 60 from the first drain electrode 30d. Specifically, a third insulating layer 62 is formed on the second insulating layer 42 using a material, such as $SiO_x$ or $SiN_x$, so as to cover the second gate electrode 60. Thereafter, partial regions of the third insulating layer 62 and the second insulating layer 42 are etched, thereby forming a first contact hole $h_1$ through which a partial region of the first drain electrode 30d is exposed and forming a second contact hole $h_2$ through which a partial region of the second gate electrode 60 is exposed. Next, a conductive material, such as Al or Mo, is filled in each of the first and second contact holes $h_1$ and $h_2$, thereby forming the first interconnection line 70 that connects the first drain electrode 30d and the second gate electrode 60. Through the processes described herein, the driving device for a unit pixel of an OLED can be manufactured. Specifically, the structure of the driving device for a unit pixel of an OLED and a method of manufacturing the same have been improved so that channels in a switching TFT and a driving TFT can be simultaneously formed in one process. As a result, the driving device for a unit pixel of an OLED can be manufactured in a smaller number of simpler and easier processes.

Figure 5:
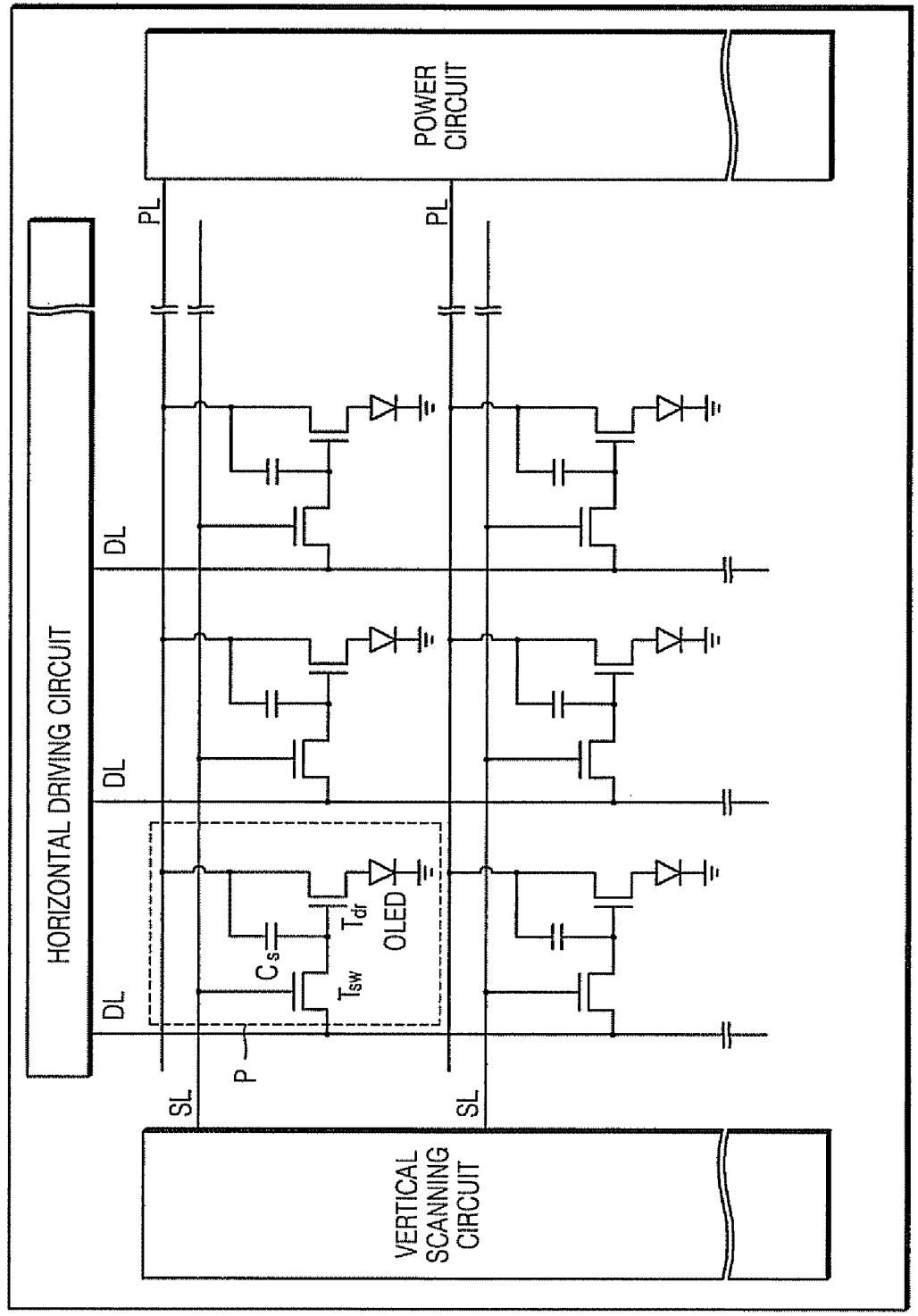
FIG. 5 is a schematic cross-sectional view of a unit pixel of an OLED.
Figure 6:
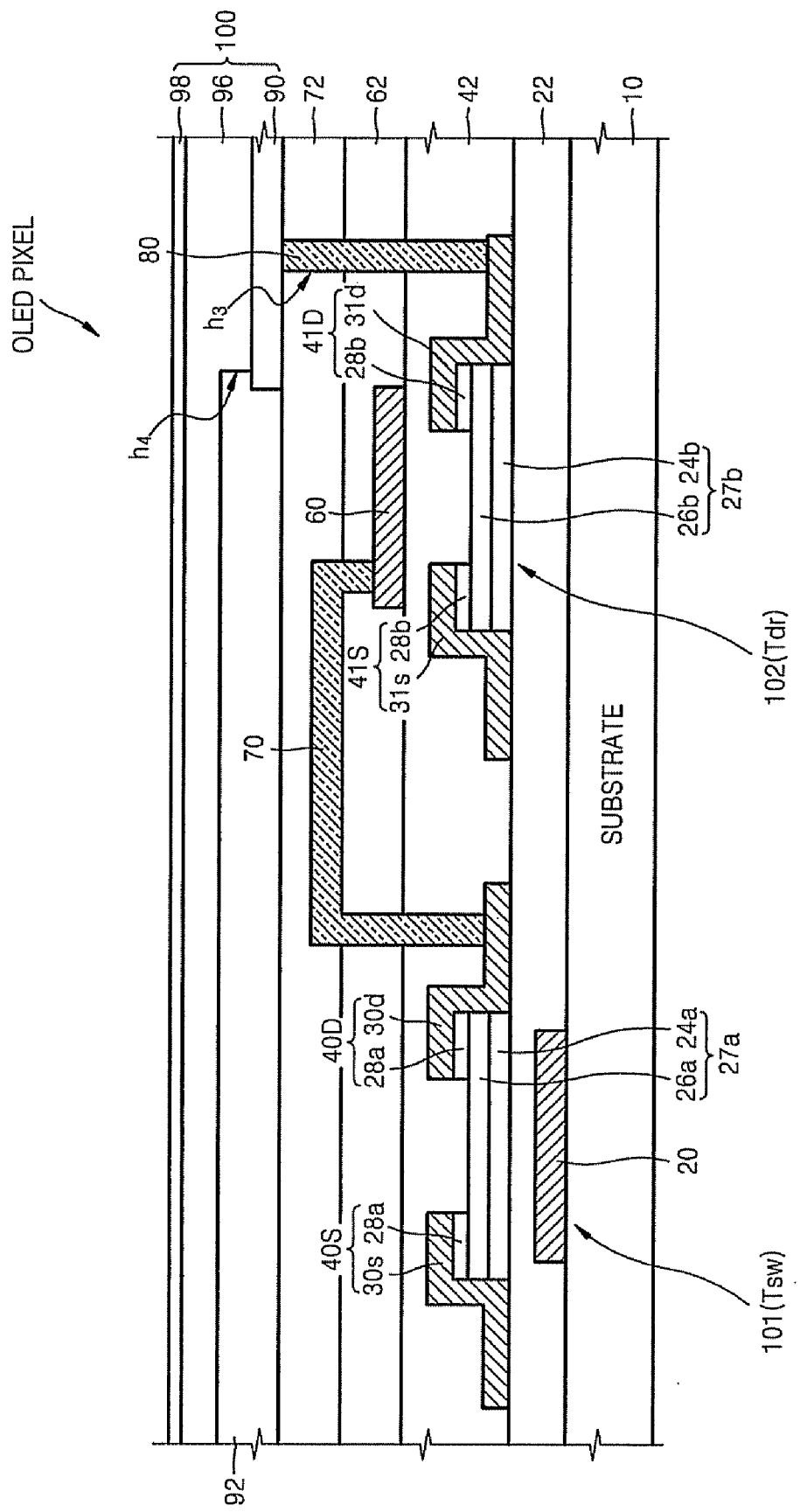
FIG. 6 illustrates layout of main configuration of the unit pixel of an OLED as illustrated in FIG. 5.

FIG. 5 is a schematic cross-sectional view of a unit pixel of an OLED. FIG. 6 illustrates layout of main configuration of the unit pixel of an OLED as illustrated in FIG. 5, and FIG. 7 is an equivalent circuit diagram showing a schematic structure of an OLED.

Figure 7:
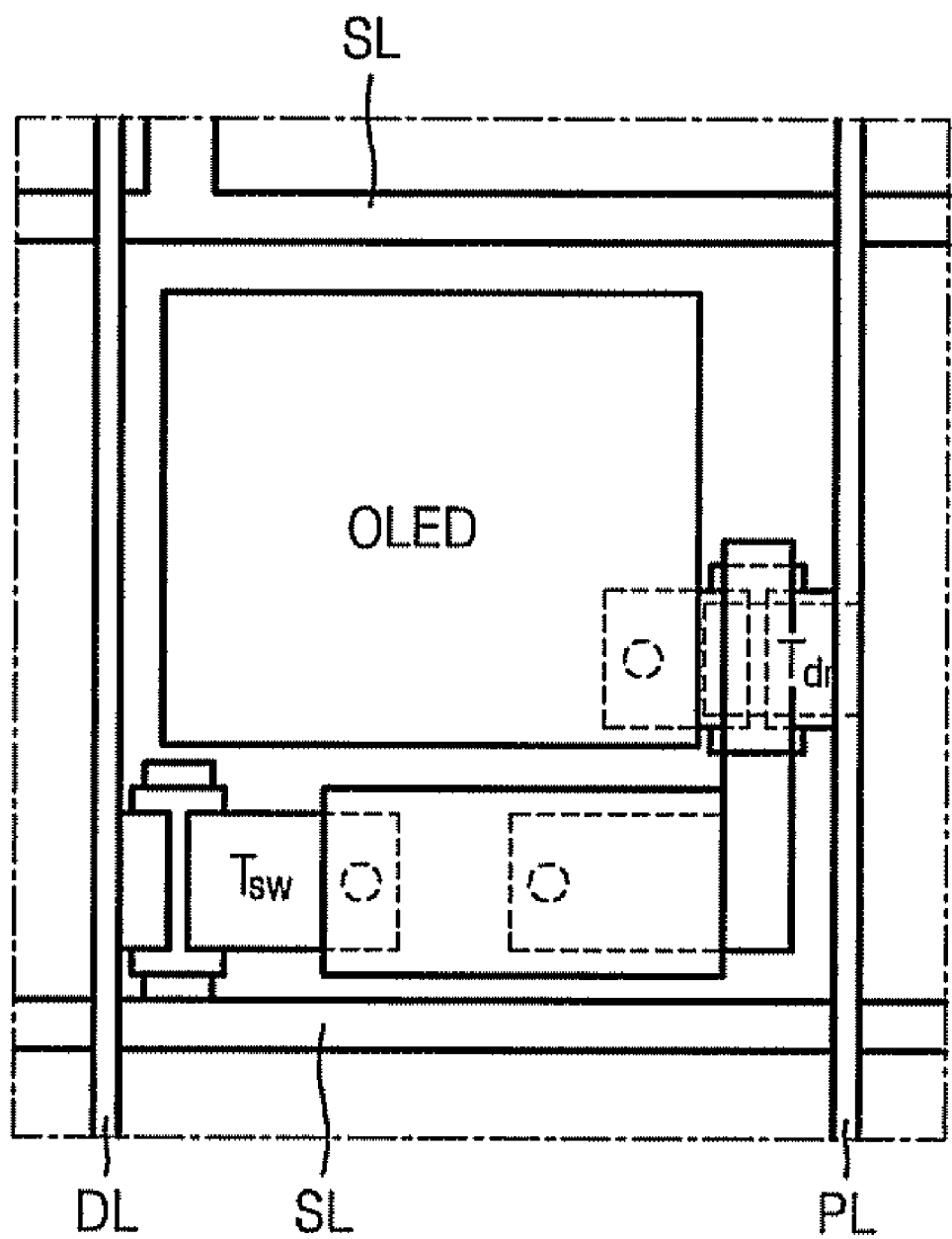
FIG. 7 is an equivalent circuit diagram showing a schematic structure of an OLED.

Referring to FIGS. 5 through 7, the OLED is disposed on a substrate 10 in a matrix shape and comprises a plurality of unit pixels (P). Each of the unit pixels (P) comprises a driving device for a unit pixel having a pair of a switching TFT 101 and a driving TFT 102, which are in electrical communication with each other, and an OLED 100 for a unit pixel.

Referring to FIG. 6, the OLED 100 for a unit pixel comprises a first electrode 90, an organic light emitting layer 96, and a second electrode 98. The first electrode can be formed of a transparent conductive material, such as indium tin oxide (ITO), and serves as an anode. Materials used in forming the organic light emitting layer 96 and methods of manufacturing the same are known. The second electrode 98 can be formed of a conductive material, such as Al or silver (Ag), and serves as a cathode. The first electrode 90 of the OLED 100 is in communication with a second drain electrode 31d of the driving TFT 102 via a second interconnection line 80 which may be formed of a conductive material, such as Al or Mo.

In view of a method of manufacturing the OLED 100 for a unit pixel, in succession to the process of FIG. 4K, a fourth insulating layer 72 is formed on the entire surface of the third insulating layer 62 using a material, such as $SiO_x$ or $SiN_x$, so as to be disposed upon the first interconnection line 70. Thereafter, the second, third, and fourth insulating layers 42, 62, and 72 are sequentially etched, thereby forming a third contact hole $h_3$ through which a partial region of the second drain electrode 31d is exposed. The interconnect line 80 is disposed in the hole h3 via conventional deposition method, such as sputtering, thermal evaporation or ion beam evaporation. Next, the first electrode 90 is formed on the fourth insulating layer 72 using a transparent conductive material, such as ITO, so as to contact the second interconnection line 80. Next, a fifth insulating layer 92 is formed on the entire surface of the fourth insulating layer 72 using a material, such as $SiO_x$ or $SiN_x$, so as to cover the first electrode 90. Next, a partial region of the fifth insulating layer 92 is etched, thereby forming a fourth contact hole $h_4$ through which the first electrode 90 is exposed. Next, the organic light-emitting layer 96 is formed on the fifth insulating layer 92 so as to cover the first electrode 90, and a second electrode 98 is formed on the organic light-emitting layer 96 using a conductive material, such as Al or Ag.

Referring once again to FIGS. 5, 6 and 7, in the OLED, a first source electrode 30s of a switching TFT 101 is electrically connected to a data line (DL) to which a data signal is input from a horizontal driving circuit (as can be seen in the FIG. 5), for example. As such, the data line DL can be electrically connected to a second gate electrode 60 of a driving TFT 102 through the first source electrode 30s and the first drain electrode 30d of the switching TFT 101. A first gate electrode 20 of the switching TFT 101 is electrically connected to a select line (SL) to which a select signal is input from a vertical scanning circuit. A second source electrode 31s of the driving TFT 102 is electrically connected to a power line (PL) to which a driving power is supplied from a power circuit. As such, the power line PL can be connected to each OLED 100 for a unit pixel through the second source electrode 31s and the second drain electrode 31d of the driving TFT 102.

The data line DL and the select line SL are disposed to cross perpendicular to each other, and a unit pixel P is defined by a crossing data line DL and a crossing select line SL. Meanwhile, a portion extending from the first drain electrode 30d of the switching TFT 101 and the second gate electrode 60 of the driving TFT 102, which are in communication with each other, and the power line PL can constitute a storage capacitor $C_s$ of FIG. 7.

In an embodiment, the driving device for a unit pixel of an OLED comprises a switching TFT and a driving TFT that can be manufactured by a series of consecutive processes. Specifically, the structure of the driving device for a unit pixel of an OLED and the method of manufacturing the same have been improved so that channels in a switching TFT and a driving TFT can be simultaneously formed in one process. As a result, the driving device for a unit pixel of an OLED according to the present invention can be manufactured in a smaller number of processes and in simpler and easier processes compared to the prior art. Accordingly, defect rates during manufacturing can be reduced, and manufacturing yields can be increased, thereby, manufacturing reproducibility and reliability can be improved.

While the subject matter of the claims has been shown and described with reference to exemplary embodiments thereof, it will be understood by those of ordinary skill in the art that various changes in form and details can be made therein without departing from the spirit and scope of the following claims.

What is claimed is:

1. A driving device for a unit pixel of an organic light emitting display, the driving device for a unit pixel comprising:
    a switching thin film transistor (TFT) and a driving TFT, which are disposed on a substrate and in communication with each other;
    wherein the switching TFT comprises a first dual channel layer and a first gate electrode, the first dual channel layer comprising a first amorphous semiconducting silicon layer and the first polycrystalline silicon layer, and a first gate electrode is disposed below the first dual channel layer;
    wherein the driving TFT comprises a second dual channel layer and a second gate electrode, the second dual channel layer comprising a second amorphous semiconducting silicon layer and a second polycrystalline silicon layer, and the second gate electrode is disposed above the second dual channel layer, and wherein a first insulating layer is disposed between the first dual channel layer and the first gate electrode and a second insulating layer is disposed between the second dual channel layer and the second gate electrode.

2. The driving device of claim 1, wherein the first and second amorphous silicon layers are formed to a thickness of about 10 to about 500 Å.

3. The driving device of claim 1, wherein the first and second crystalline silicon layers are formed to a thickness of about 500 to about 3000 Å.

4. The driving device of claim 1, wherein a first source region and a first drain region are disposed at opposite sides of the first dual channel layer.

5. The driving device of claim 4, wherein the first source region comprises an n-doped silicon layer and a first source electrode, which are disposed on an end of the first dual channel layer.

6. The driving device of claim 4, wherein the first drain region comprises an n-doped silicon layer and a first drain electrode, which are disposed on an a side of the first dual channel layer opposite the first source region.

7. The driving device of claim 4, wherein the first source region or the first drain region is in electrical communication with the switching TFT.

8. The driving device of claim 1, wherein a second source region and a second drain region are disposed at opposites sides of the second dual channel layer.

9. The driving device of claim 8, wherein a second source region comprises an n-doped silicon layer and a second source electrode.

10. The driving device of claim 8, wherein the second drain region comprises an n-doped Si layer and a second drain electrode, which are disposed on a side of the second dual channel layer opposed to the second source region.

11. An organic light emitting display comprising: a plurality of unit pixels disposed on a substrate in a matrix shape,
    wherein each of the unit pixels comprises:
        a driving device for a unit pixel further comprising a switching TFT and a driving TFT that are in electrical communication with each other; and
        an organic light emitting device for a unit pixel;
    wherein the switching TFT comprises a first dual channel layer and a first gate electrode, the first dual channel layer having a first amorphous semiconducting silicon layer and a first polycrystalline silicon layer, and the first gate electrode is disposed below the first dual channel layer;
    wherein the driving TFT comprises a second dual channel layer and a second gate electrode, the second dual channel layer having a second amorphous semiconducting silicon layer and a second polycrystalline silicon layer, and a second gate electrode is disposed above the second dual channel layer, and wherein a first insulating layer is disposed between the first dual channel layer and the first gate electrode and a second insulating layer is disposed between the second dual channel layer and the second gate electrode.

12. The organic light emitting display of claim 11, wherein the first and second amorphous silicon layers are formed to a thickness of about 10 to about 500 Å.

13. The organic light emitting display of claim 11, wherein the first and second crystalline silicon layers are formed to a thickness of about 500 to about 3000 Å.

14. The organic light emitting display of claim 11, wherein a first source region and a first drain region are formed at opposite sides of the first dual channel layer.

15. The organic light emitting display of claim 14, wherein the first source region or the first drain region is in communication with the second gate electrode so that the driving TFT and the switching TFT are in electrical communication with each other.

16. The organic light emitting display of claim 11, wherein a second source region and a second drain region are disposed at opposite end of the second dual channel layer.

* * * * *